United States Patent [19]

Suesserman

[11] Patent Number: 5,300,896
[45] Date of Patent: Apr. 5, 1994

[54] BOOTSTRAPPED, AC-COUPLED DIFFERENTIAL AMPLIFIER

[76] Inventor: Michael F. Suesserman, 2722 NE. Blakeley St., Seattle, Wash. 98105

[21] Appl. No.: 962,500
[22] Filed: Oct. 16, 1992
[51] Int. Cl.$^5$ .............................................. H03F 3/45
[52] U.S. Cl. ........................................ 330/260; 330/69
[58] Field of Search ............ 330/69, 107, 109, 124 R, 330/252, 258, 260

[56] References Cited

U.S. PATENT DOCUMENTS

| | | | |
|---|---|---|---|
| 4,047,122 | 9/1977 | Rao | 330/84 |
| 4,242,741 | 12/1980 | Parrish | 330/258 X |
| 4,320,351 | 3/1982 | Brown | 330/260 |
| 4,679,002 | 7/1987 | Sherwin et al. | 330/69 X |

*Primary Examiner*—Steven Mottola
*Attorney, Agent, or Firm*—Graybeal Jackson Haley & Johnson

[57] ABSTRACT

An ac-coupled differential amplifier having a high common mode rejection ratio (CMRR) and input impedance is disclosed. The ac-coupled amplifier includes a bootstrapped input stage and first and second operational amplifiers, each having a first input, a second input, and an output. The bootstrapped input-stage has a pair of RC high-pass filters, each of which is comprised of a capacitor connected to the first input of each of the operational amplifiers and a pair of resistors connected in series between ground and the first input of each of the operational amplifiers. A pair of bootstrap capacitors connect between each of the series connected resistor pairs of each of the two RC high-pass filters and the second input of each of the operational amplifiers.

24 Claims, 3 Drawing Sheets

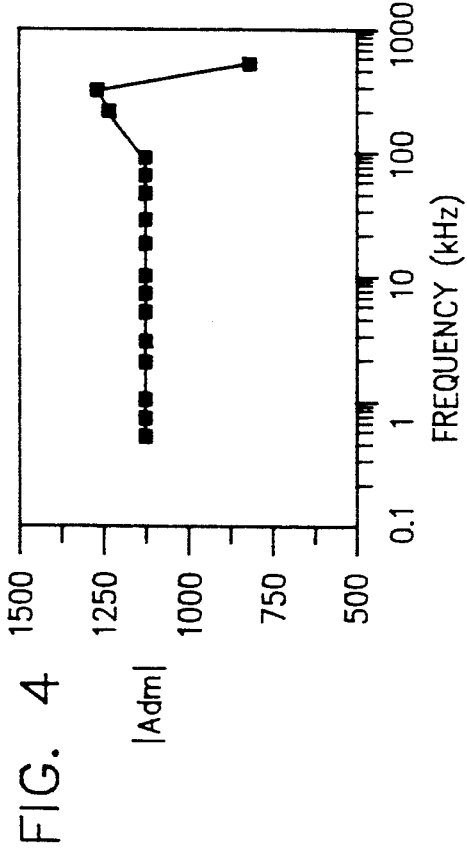
FIG. 4
FIG. 5
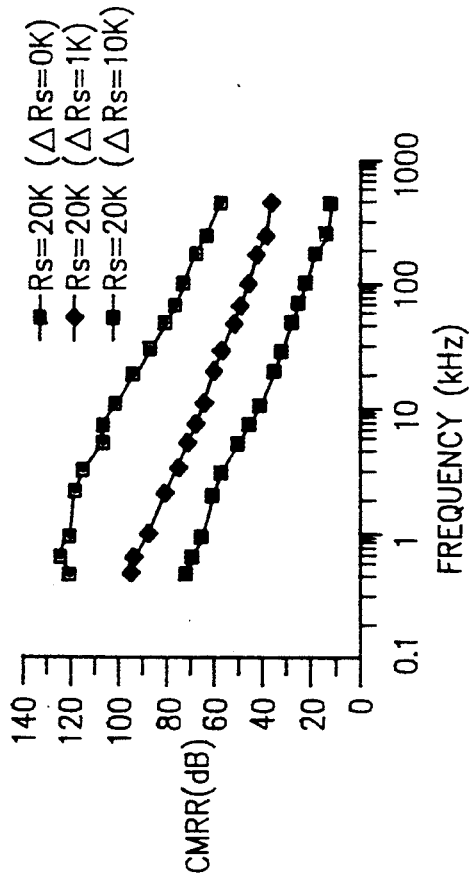
FIG. 6
FIG. 7

BOOTSTRAPPED, AC-COUPLED DIFFERENTIAL AMPLIFIER

BACKGROUND OF THE INVENTION

Differential amplifiers are designed to selectively amplify the difference between low-level electrical signals while rejecting large common-mode signals. Dc-coupled differential amplifier designs, such as instrumentation amplifiers, achieve large gain, high input impedance, and high common-mode rejection ratio (CMRR). This invention relates to differential amplifiers including those used as ac-coupled instrumentation amplifiers.

Although instrumentation amplifier designs offer superior signal processing performance for dc-coupled measurement applications, much of the performance is degraded by the modifications presently used to design ac-coupled differential amplifiers. Optimization of instrumentation amplifier designs for specific signal processing applications has been described in numerous technical journals and textbooks. For example, see sections 7.09 and 7.10 (pp. 421–428) of *The Art of Electronics*, Second Edition, P. Horowitz and W. Hill, Cambridge University Press, 1990. Given an appropriate dc-coupled differential or instrumentation amplifier design, two general approaches have been used to design ac-coupled differential amplifiers: (1) directly ac-couple both inputs of a dc-coupled instrumentation or differential amplifier (i.e., connect RC high pass filters across the inputs) or (2) connect ac-coupled, unity-gain buffer amplifiers to each input of a dc-coupled instrumentation or differential amplifier. Both approaches presently used for designing ac-coupled differential amplifiers produce amplifiers with significant limitations. The first approach offers less complexity than other alternatives; however, directly ac-coupling an instrumentation or differential amplifier loads the input of the amplifier, which substantially lowers input impedance of the differential amplifier and degrades CMRR of the differential amplifier (particularly at frequencies over a hundred hertz). The second approach produces an ac-coupled differential amplifier with very high input impedance; however, ac mismatches between the input buffer amplifiers substantially degrade CMRR of the differential amplifier, particularly at frequencies over a few hundred hertz.

To overcome the difficulties associated with designing ac-coupled differential amplifiers with performance adequate for use in a wide range of measurement applications, numerous specific designs have been developed to optimize performance of ac-coupled differential amplifiers for specific applications with particular processing requirements. For example, in U.S. Pat. No. 4,320,351, issued to Brown, the differential amplifier represents an example of the second general design approach described above. Specifically, two high-input-impedance, ac-coupled buffer amplifiers were connected to a differential amplifier in a fashion that produced an ac-coupled differential amplifier with superior performance over a very narrow range of frequencies (approximately 10 to 100 Hz). Notice in FIG. 2 of U.S. Pat. No. 4,320,351 that CMRR of the amplifier degrades at very low frequencies (greater than 10 Hz); as discussed above, the degraded CMRR occurs due to ac mismatches between the buffer amplifiers connected to both inputs of the differential amplifier. In general, all prior ac-coupled differential amplifiers have been designed to insure sufficient performance for specific applications.

No prior ac-coupled differential amplifier design has been able to retain all of the superior performance, including high input impedance and high CMRR, inherent in dc-coupled instrumentation and differential amplifier designs.

A need thus exists for an ac-coupled differential amplifier design that retains all of the superior performance inherent in dc-coupled instrumentation and differential amplifier designs. A need also exists for an ac-coupled differential amplifier design that simultaneously offers high input impedance and high CMRR. A further need exists for an ac-coupled differential amplifier design that can achieve superior performance with substantially less complexity than prior designs. A need also exists for an ac-coupled differential amplifier design that can achieve superior and reliable performance at substantially less cost than prior designs. Finally, a need exists for an ac-coupled differential amplifier design that can be produced by simple and inexpensive modifications of many commonly used instrumentation and differential amplifier designs.

SUMMARY OF THE INVENTION

An ac-coupled differential amplifier is provided having a high common mode rejection ratio (CMRR) and a bootstrapped input stage for enhanced input impedance. The ac-coupled differential amplifier includes a differential input stage and a differential output stage.

The differential input stage has differential inputs and differential outputs. Differential input stage followers (typically a pair of matched operational amplifier followers) receive ac-coupled differential input signals from bootstrapped high-pass filters. Each follower contains an operational amplifier that has a first input, a second input, and an output. The operational amplifier outputs are the differential outputs of the input stage. A pair of balanced resistors connect between the second input and output of each operational amplifier. The pair of operational amplifier followers are coupled by a resistor connected between the second input of both operational amplifiers. A pair of RC high-pass filters ac-couple the differential inputs, and each has a capacitor connected to the first input of one of the operational amplifiers and a pair of resistors connected in series between ground and the first input of the same operational amplifier. A pair of bootstrap capacitors are also provided in the differential input stage; one each for connecting between the series connected resistor pairs of the two RC high-pass filters and the second input of the associated operational amplifier.

Most preferably, the differential output stage is a third operational amplifier having a first input, a second input and an output. A pair of balanced resistors separately connect the outputs of the first and second follower amplifiers with the differential first and second inputs of the third operational amplifier. The differential output stage contains a second pair of balanced resistors with one connected between the first input of the third operational amplifier and ground, and the other connected between the second input and the output of the third operational amplifier.

Most preferably, the amplifier of the present invention is configured to operate in frequency ranges of either between about 0.5 and about 100 kHz or about 0.5 and about 10000 Hz.

The present invention can be configured as an instrumentation amplifier, a differential amplifier, or an input stage for either of the above.

BRIEF DESCRIPTION OF THE DRAWINGS

The foregoing objects and most of the attendant advantages of this invention will become more readily appreciated as the same becomes better understood by reference to the following detailed description when taken in conjunction with the accompanying drawings wherein:

FIG. 4 shows a graph of the performance of the amplifier of the present invention having a frequency range of about 0.5 to about 100 kHz in which the magnitude of differential gain versus frequency is shown;

FIG. 5 shows a graph of the performance of the amplifier of the present invention having a frequency range of about 0.5 to about 100 kHz in which the phase of differential gain (in degrees) versus frequency is shown;

FIG. 6 shows a graph of the performance of the amplifier of the present invention having a frequency range of about 0.5 to about 100 kHz in which CMRR versus frequency is shown;

FIG. 7 shows a graph of the performance of the amplifier of the present invention having a frequency range of about 0.5 to about 10,000 Hz in which the magnitude of differential gain versus frequency is shown;

DETAILED DESCRIPTION OF THE PREFERRED EMBODIMENT

Figure 1:
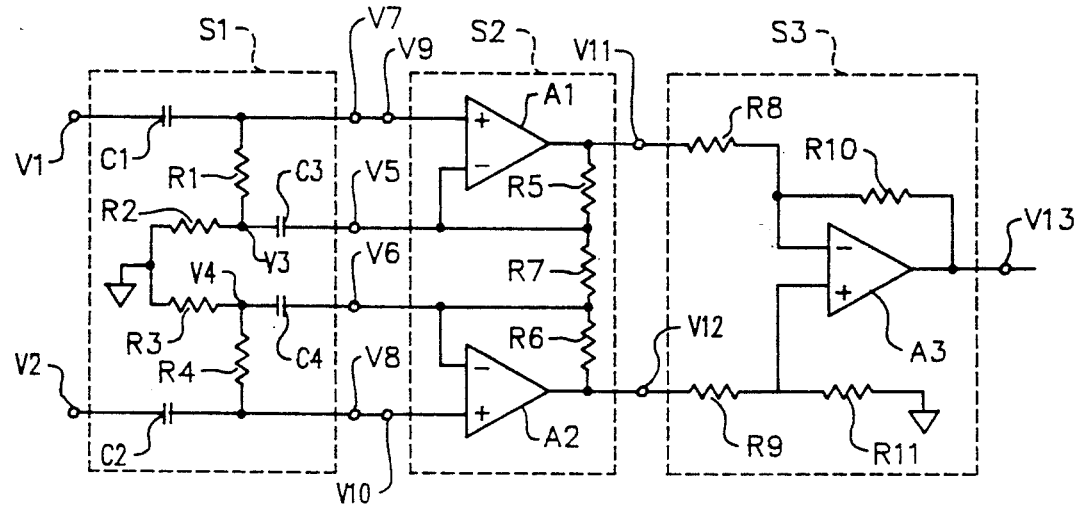
FIG. 1 shows a schematic circuit diagram of an ac-coupled instrumentation amplifier that embodies the present invention.
Figure 2:
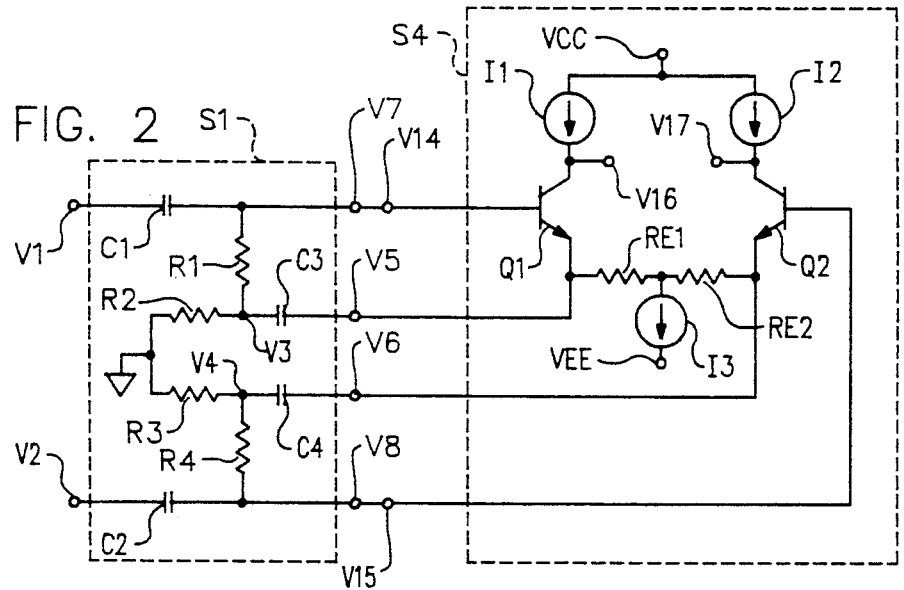
FIG. 2 shows a schematic circuit diagram of an ac-coupled differential amplifier that embodies the present invention.
Figure 3:
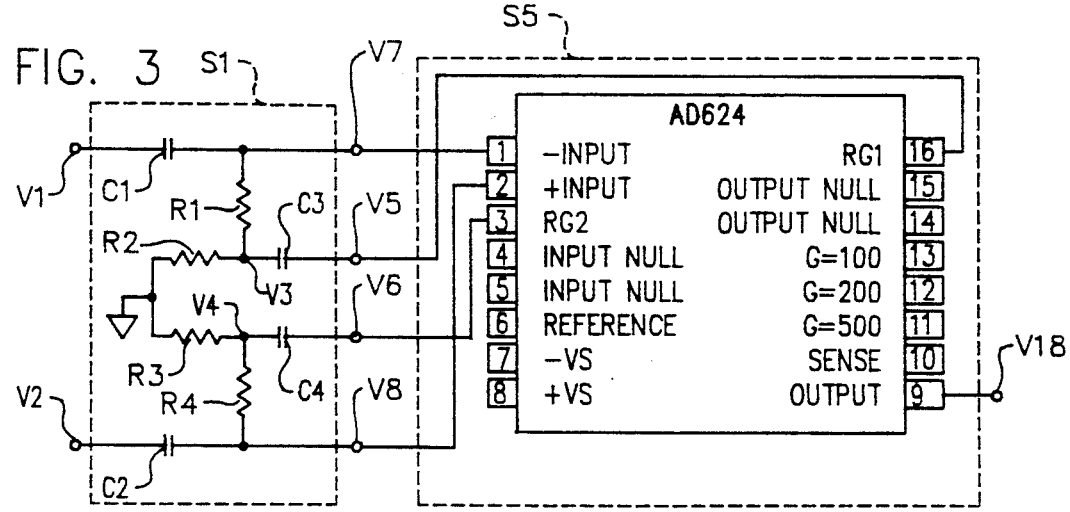
FIG. 3 shows a specific embodiment of the schematic circuit diagram of FIG. 2 in which the ac-coupled input-stage is connected to the differential amplifier input-stage of an AD624 IC.

Typical ac-coupled instrumentation or differential amplifiers that embody the present invention are illustrated in FIGS. 1, 2, and 3. In FIGS. 1, 2, and 3, the first stage, S1, contains the bootstrapped ac-coupling components that embody the present invention. The differential voltage inputs of the input-stage are the terminals V1 and V2. Ac-coupled differential voltages are presented to the inputs of subsequent instrumentation (S2 and S3) or differential (S4 or S5) amplifiers at voltage terminals V7 and V8. Input capacitors C1 and C2 together with input resistors R1 through R4 form high pass filters that ac-couple input voltage terminals V1 and V2. Resistors R1 through R4 also provide dc bias paths for the inputs of subsequent instrumentation (inputs of A1 and A2 in S2) or differential (inputs of Q1 and Q2 in S4) amplifiers. Capacitors C3 and C4 connect or bootstrap the voltages V5 and V6 to the voltages V3 and V4 between the series connected input resistors R1 through R4. The bootstrapped input-stage output voltages V5 and V6 connect to ac voltage equivalents of V7 and V8 (such as the inverting input terminals of A1 and A2 in S2 or the emitter terminals of Q1 and Q2 in S4).

In FIG. 1, the last two stages, S2 and S3, contain the input and output stages, respectively, of a standard three-op-amp instrumentation amplifier (SIA). The differential voltage inputs of the SIA are the terminals V9 and V10, and they connect to the input-stage output voltages V7 and V8, respectively. The differential voltage inputs to the second-stage differential amplifier are the terminals V11 and V12, and the single-ended output is terminal V13. Operational amplifiers A1 and A2 form the input followers of the SIA, and operational amplifier A3 forms the second-stage differential amplifier of the SIA. Resistors R5 through R11 are connected in a fashion common to SIA designs.

The circuit in FIG. 1, contains three stages, S1, S2, and S3, common to all ac-coupled instrumentation amplifiers. The first stage, S1, contains components (C1 through C4 and R1 through R4) for ac-coupling as well as bootstrapping differential input signals. The last two stages, S2 and S3, contain components (A1 through A3 and R5 through R11) for the input and output stages of a common dc-coupled, three-op-amp instrumentation amplifier design.

An ac electrical signal, such as is generated from many biomedical and other signal transducers, is differentially connected to input capacitors C1 and C2. Differential input voltages V1 and V2 are ac-coupled by the RC high-pass filters formed by C1, R1, & R2 and C2, R4, & R3; input high-pass filter cutoff frequencies are determined by component values selected for C1, C2, and R1 through R4. Differential voltages V7 and V8 are identical to V1 and V2, respectively, except that dc and low-frequency voltages have been removed (i.e., ac-coupled). Voltages V7 (or V9) and V8 (or V10) are differentially processed by the dc-coupled instrumentation amplifier in stages S2 and S3, producing a single-ended output voltage V13.

Without bootstrap capacitors C3 and C4 connected to the circuit, the amplifier in FIG. 1 is identical to common ac-coupled instrumentation amplifiers designed by directly ac-coupling the inputs of standard dc-coupled instrumentation amplifiers (such as stages S2 and S3). In addition to decreasing the input impedance of an ac-coupled differential amplifier (i.e., input impedances reduce to R1+R2 and R4+R3), input ac loading caused by the RC high-pass filter network significantly degrades CMRR of the dc-coupled instrumentation amplifier in stages S2 and S3.

With bootstrap capacitors C3 and C4 connected to the circuit, the ac-coupled instrumentation amplifier in FIG. 1 exhibits a combination of properties and performance not attainable with prior art designs. Specifically, C3 and C4 ac-couple voltages on the inverting inputs of A1 and A2 (i.e., V5 and V6) to voltage terminals V3 and V4, respectively. Since the voltage drop across the inverting and non-inverting inputs of A1 and A2 equals zero, C3 and C4 bootstrap the input resistors such that the ac voltage drop across both R1 and R4 is approximately zero. Ac input impedance of the ac-coupled differential amplifier is raised substantially by bootstrapping input resistors R1 and R4 with C3 and C4. In addition, bootstrap capacitors C3 and C4 decrease ac input current flow to near zero (i.e., ac current flow through R1 and R4 decreases to near zero), which eliminates the ac input loading normally caused by ac-coupling the input of a dc-coupled instrumentation amplifier. Directly bootstrapping the input-stage followers (stage S2) of standard dc-coupled instrumentation amplifier designs (such as in stages S2 and S3) produces ac-coupled instrumentation amplifiers with both high input impedance and nondegraded CMRR (i.e., CMRR determined by the dc-coupled instrumentation amplifier design).

Dc-coupled instrumentation amplifier designs, such as in stages S2 and S3 in FIG. 1, achieve superior performance primarily due to the input-stage followers in S2. Specifically, the input-stage followers in an instrumentation amplifier transmit a potential difference applied to the inputs of the amplifier across a coupling resistor (R6 in FIG. 1) at the outputs of the followers. In general, current is produced in R6 that is proportional to potential difference across the amplifier inputs (V5 and V6); current produced in R6 induces a potential difference across V7 and V8 that is proportional to potential difference across the amplifier inputs. Since non-inverting op-amp followers have very high input impedance and very high CMRR, the input-stage followers in S2 produce a differential gain of input voltages V5 and V6 both while rejecting very large commonmode input signals (i.e., common-mode signals present in V5 and V6) and while producing a differential voltage (V7 and V8) ideally suited to further processing in the second-stage differential amplifier in S3.

Prior ac-coupled differential amplifier designs rely on either ac-coupled, unity-gain buffer amplifiers or RC high-pass filters connected to the inputs of dc-coupled instrumentation amplifiers. For unity-gain input buffer based designs, ac mismatches between buffer amplifiers substantially degrade CMRR of the dc-coupled instrumentation amplifier. For high-pass filter based designs, input loading caused by the RC filters substantially degrades both input impedance and CMRR of the dc-coupled instrumentation amplifier. In general, prior art ac-coupled differential amplifier designs incorporate non-ideal input signal sources that degrade operating characteristics of the dc-coupled instrumentation amplifier.

The present invention retains the superior properties of dc-coupled instrumentation amplifier designs (primarily CMRR) while adding input ac-coupling with high input impedance. This is achieved because capacitors C3 and C4 bootstrap input resistors R1 and R4, which eliminates ac input current flow. In addition to increasing ac input impedance, the bootstrapped resistors eliminate input loading of the op-amp followers (A1 and A2 in S2). Therefore, CMRR of the ac-coupled differential amplifier is determined by CMRR of the underlying dc-coupled instrumentation amplifier design.

In FIG. 2, stage S4 contains a general transistor differential amplifier (DA). The differential voltage inputs of the DA are the terminals V14 and V15, and they connect to the input-stage output voltages V7 and V8, respectively. The differential voltage outputs of the DA are the terminals V16 and V17. DC current sources I1, I2, and I3 as well as emitter resistors RE1 and RE2 bias the transistors to insure linear operation. All common variations of the general DA in FIG. 2 connect to the input-stage, S1, in a fashion similar to that shown in FIG. 2. Examples of common DA variations include: (1) DAs involving different transistor types (i.e., FET instead of BJT) or arrangements (i.e., transistors connected in Darlington, cascode, etc. arrangements), (2) a DA with DC current sources I1, I2, or I3 replaced by simple resistors, or (3) a DA with I3 replaced by two independent DC current sources (one for each transistor) and emitter resistors RE1 and RE2 removed. A specific embodiment of the ac-coupled differential amplifier in FIG. 2 is shown in FIG. 3, and it contains input-stage, S1, connected to the differential amplifier input-stage of an AD624 (Analog Devices; Norwood, Mass.), which is a commercially available instrumentation amplifier integrated circuit with a differential amplifier input-stage.

The circuit in FIG. 2, contains two stages, S1 and S4, common to all ac-coupled differential amplifiers. The first stage, S1, contains components (C1 through C4 and R1 through R4) for ac-coupling as well as bootstrapping differential input signals. The second stage, S4, contains components (Q1, Q2, RE1, RE2, I1, I2, and I3) for a common dc-coupled differential amplifier design. Operation of the ac-coupled differential amplifier shown in FIG. 2 is identical to that described above for the ac-coupled instrumentation amplifier shown in FIG. 1. In general, with bootstrap capacitors C3 and C4 connected to the circuit, the ac-coupled differential amplifier in FIG. 2 exhibits a combination of properties and performance not attainable with prior art designs. Directly bootstrapping the input-stage followers (Q1 and Q2 in S4) of standard dc-coupled differential amplifier designs (such as in stage S4) produces ac-coupled differential amplifiers with both high input impedance and nondegraded CMRR (i.e., CMRR determined by the dc-coupled instrumentation amplifier design).

The following is a list of the reference symbols employed in the above description:

V1 differential input-stage inverting input voltage.
V2 differential input-stage non-inverting input voltage.
V3 bootstrapped input-stage inverting input voltage.
V4 bootstrapped input-stage non-inverting input voltage.
V5 bootstrapped input-stage inverting output voltage.
V6 bootstrapped input-stage non-inverting output voltage.
V7 differential input-stage inverting output voltage.
V8 differential input-stage non-inverting output voltage.
V9 inverting instrumentation amplifier input voltage.
V10 non-inverting instrumentation amplifier input voltage.
V11 inverting instrumentation amplifier 2nd-stage voltage.
V12 non-inverting instrumentation amplifier 2nd-stage voltage.
V13 instrumentation amplifier output voltage.
V14 inverting differential amplifier input voltage.
V15 non-inverting differential amplifier input voltage.
V16 inverting differential amplifier output voltage.
V17 non-inverting differential amplifier output voltage.
VCC positive DC transistor bias voltage (typically +15 V DC).
VEE negative DC transistor bias voltage (typically −15 V DC).
V18 AD624 output voltage.
R1-R4 input-stage resistors.
R5-R11 instrumentation amplifier resistors.

RE1 & RE2  differential amplifier emitter resistors.
C1 & C2  input-stage input capacitors.
C3 & C4  input-stage bootstrap capacitors.
A1, A2, & A3  op-amps.
Q1 & Q2  transistors.
I1, I2, & I3  DC transistor-bias current sources.
S1  input-stage that contains RC components for ac-coupling instrumentation and differential amplifiers.
S2  stage contains instrumentation amplifier input-stage followers.
S3  stage that contains an instrumentation amplifier output-stage differential amplifier.
S4  stage that contains a differential amplifier.
S5  stage that contains the pin-out for AD624 instrumentation amplifier IC having a differential amplifier input-stage.

Without limiting the scope of the present invention, the following examples will be used to illustrate specific embodiments of the present invention. In particular, two specific input-stage (S1 of FIGS. 1, 2 or 3) component combinations (IS1 and IS2), two specific instrumentation amplifier (S2 and S3 of FIG. 1) designs (ACamp1 and ACamp2), and one specific differential amplifier (S5 of FIG. 3) design (ACamp3) will be used to characterize the present invention. The specific values used for components in IS1, IS2, ACamp1, ACamp2, and ACamp3 are as follows:

(a) IS1 (S1): C1 = C2 = C3 = C4 = 0.1 $\mu$F and

R1 = R2 = R3 = R4 = 1 M$\Omega$ (b) IS2 (S1): C1 = C2 = C3 = C4 = 1.0 $\mu$F and R1 = R2 = R3 = R4 = 10 M$\Omega$ (c) ACamp1 (S1, S2, & S3):  S1 = IS1

A1 = A2 = A3 = OP-37

R5 = R6 = 5 k$\Omega$; R7 = 365 $\Omega$

R8 = R9 = 500 $\Omega$;

R10 = R11 = 20 k$\Omega$ (d) ACamp2 (S1, S2, & S3):  S1 = IS2

A1 = A2 = 1/2 LF353;

A3 = LF356

R5 = R6 = R8 = R9 = 10 k$\Omega$

R7 = 137 $\Omega$; R10 = R11 = 100 k$\Omega$ (e) ACamp3 (S1 & S5):  S1 = IS2 and S5 = AD624

In IS1, the choice of 1 M$\Omega$ for all resistors and 0.1 $\mu$F for all capacitors creates input and bootstrap high-pass filters with cutoff frequencies of approximately 10 Hz; in IS2, the choice of 10 M$\Omega$ for all resistors and 1.0 $\mu$F for all capacitors creates input and bootstrap high-pass filters with cutoff frequencies of approximately 0.1 Hz. Input component values are readily adjusted for higher or lower frequency measurement applications without significantly affecting performance of the ac-coupled differential amplifier; however, ac cutoff frequencies of 0.1 Hz (IS2) and 10 Hz (IS1) cover most common biomedical and other analog instruments presently in use.

All resistors (except R11) in ACamp1, ACamp2, ACamp3 are 1% precision resistors, and balanced resistor pairs (such as R5 & R6 and R8 & R9) are matched to within 0.5% using a FLUKE 70 DMM. In ACamp1, ACamp2, and ACamp3, an adjustable potentiometer is used for R11, and the potentiometer is adjusted to maximize CMRR. Similar results to those obtained with an R11 potentiometer can be achieved with very well matched precision resistors used for R10 and R11. All capacitors in ACamp1, ACamp2, and ACamp3 are monolithic type capacitors (typically 10% tolerance); however, similar performance is achieved with other appropriate types of capacitors.

The dc-coupled instrumentation amplifier of ACamp1 (S2 and S3) is identical to the wide-bandwidth design optimized for high CMRR described in FIG. 5.13 on page 207 of *Design with Operational Amplifiers and Analog Integrated Circuits*, S. Franco, McGraw-Hill, 1988.

The dc-coupled instrumentation amplifier of ACamp2 (S2 and S3) represents a design optimized for minimum cost and complexity as well as superior low frequency performance (<1000 Hz).

The dc-coupled instrumentation amplifier of ACamp3 (S5) is an AD624 (Analog Devices; Norwood Mass.), which is a commercially available instrumentation amplifier integrated circuit with a differential amplifier input-stage.

Operating characteristics of ACamp1, constructed using the above specified components, are summarized in the following table both for a prior art design without C3 and C4 connected to the circuit and for a circuit embodying the present invention with C3 and C4 connected to the circuit:

| Amplifier Property | ACamp1 without C3 and C4 connected | ACamp1 with C3 and C4 connected | Brief Description |
|---|---|---|---|
| Bandwidth | $\approx$500 kHz | $\approx$500 kHz | 3-dB bandwidth |
| Gain | $\approx$1200 | $\approx$1200 | differential gain (measured at 1 kHz) |
| Input Current | 1.15 nA | 0.46 nA | ac input current (measured at 1 kHz) |
| Input Impedance | 2.2 M$\Omega$ | >75 M$\Omega$ in parallel with <5 pF | differential input impedance (measured at 1 kHz) |
| Slew Rate | 20 V/$\mu$sec | >20 V/$\mu$sec (40 V/$\mu$sec maximum) | (measured at 1 kHz) |
| CMRR* | 107 dB @ 1 kHz | 120 dB @ 1 kHz | 20 k$\Omega$ |
|  | 107 dB @ 10 kHz | 104 dB @ 10 kHz | source impedance (no imbalance) |
|  | 74 dB @ 100 kHz | 75 dB @ 100 kHz |  |
|  | 77 dB @ 1 kHz | 98 dB @ 1 kHz | 20 k$\Omega$ |
|  | 73 dB @ 10 kHz | 85 dB @ 10 kHz | source impedance (274$\Omega$ imbalance) |
|  | 54 dB @ 100 kHz | 65 dB @ 100 kHz |  |
|  | 65 dB @ 1 kHz | 84 dB @ 1 kHz | 20 k$\Omega$ |
|  | 61 dB @ 10 kHz | 64 dB @ 10 kHz | source impedance (1 k$\Omega$ imbalance) |
|  | 42 dB @ 100 kHz | 44 dB @ 100 kHz |  |

*CMRR is maximized once for each amplifier over a 1 to 100 kHz bandwidth; all CMRR measurements are acquired without further adjustments to improve CMRR at specific frequencies.

Notice from the table of results for ACamp1 that bootstrapping the input-stage followers of a standard dc-coupled instrumentation amplifier design produces an ac-coupled differential amplifier with a combination of both high input impedance and high CMRR. FIG. 4, FIG. 5 and FIG. 6 are graphical representations of the operating performance of ACamp1 over a frequency range of about 0.5 kHz to over 100 kHz in which the magnitude of differential gain versus frequency, the phase of differential gain (in degrees) versus frequency, and CMRR versus frequency, respectively, are shown.

Operating characteristics of ACamp2, constructed using the above specified components, are summarized in the following table both for a prior art design without C3 and C4 connected to the circuit and for a circuit embodying the present invention with C3 and C4 connected to the circuit:

| Amplifier Property | ACamp2 without C3 and C4 connected | ACamp2 with C3 and C4 connected | Brief Description |
|---|---|---|---|
| Bandwidth | 31.5 kHz | 31.5 kHz | 3-dB bandwidth |
| Gain | ≈1500 | ≈1500 | differential gain (measured at 1 kHz) |
| Input Current | 500 pA | 66 pA | ac input current (measured at 1 kHz) |
| Input Impedance | 30 MΩ | >540 MΩ in parallel with <4 pF | differential input impedance (measured at 1 kHz) |
| Slew Rate | 2.5 V/μsec | >2.5 V/μsec | (measured at 1 kHz) |
| CMRR* | 110 dB @ 0.1 kHz | 117 dB @ 0.1 kHz | 20 kΩ |
|  | 110 dB @ 1.0 kHz | 115 dB @ 1.0 kHz | source impedance (no imbalance) |
|  | 107 dB @ 10 kHz | 108 dB @ 10 kHz |  |
|  | 86 dB @ 1.0 kHz | 106 dB @ 0.1 kHz | 20 kΩ |
|  | 83 dB @ 1.0 kHz | 87 dB @ 1.0 kHz | source impedance (1 kΩ imbalance) |
|  | 65 dB @ 10 kHz | 67 dB @ 10 kHz |  |

*CMRR is maximized once for each amplifier over a 1 to 10 kHz bandwidth; all CMRR measurements are acquired without further adjustments to improve CMRR at specific frequencies.

Figure 9:
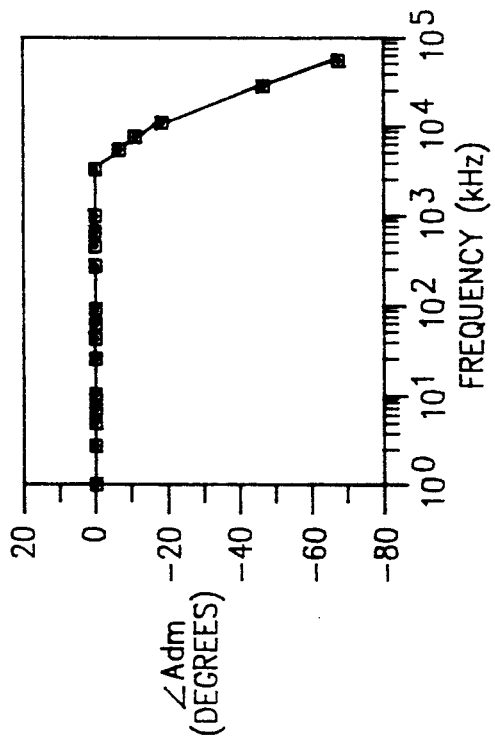
FIG. 9 shows a graph of the performance of the amplifier of the present invention having a frequency range of about 0.5 to about 10,000 Hz in which CMRR versus frequency is shown.
Figure 8:
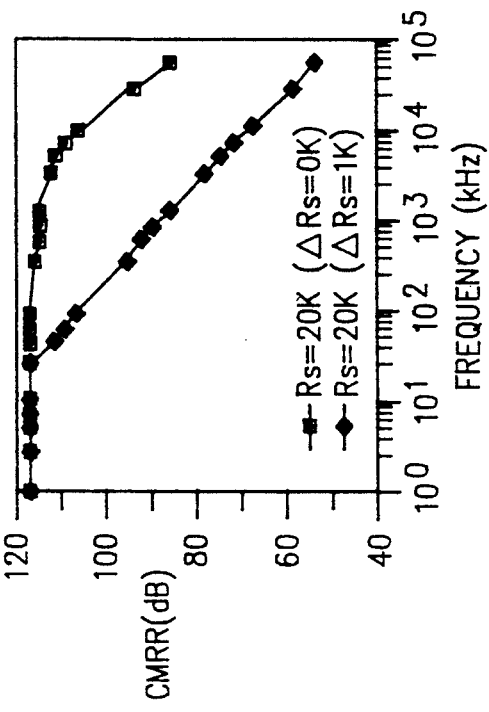
FIG. 8 shows a graph of the performance of the amplifier of the present invention having a frequency range of about 0.5 to about 10,000 Hz in which the phase of differential gain (in degrees) versus frequency is shown.

Notice from the table results for ACamp2 that bootstrapping the input-stage followers of a standard dc-coupled instrumentation amplifier design produces an ac-coupled differential amplifier with a combination of both high input impedance and high CMRR. FIG. 7, FIG. 8, and FIG. 9 are graphical representations of the operating performance of ACamp2 over a frequency range of about 0.5 to over 10,000 Hz in which the magnitude of differential gain versus frequency, the phase of differential gain (in degrees) versus frequency, and CMRR versus frequency, respectively, are shown.

Similar results to those presented above should be obtained for all dc-coupled instrumentation amplifier designs that are converted to ac-coupled differential amplifiers in a fashion described by the present invention. As with the specific examples given above, input impedance would be substantially raised and CMRR of the ac-coupled differential amplifier would determined by CMRR of the underlying dc-coupled instrumentation amplifier design. Performance improvements are limited only by nonideal operational amplifier and component behavior. In general, bootstrapping the input-stage followers of standard dc-coupled instrumentation amplifier designs produces ac-coupled differential amplifiers with characteristics that are substantially superior to prior art designs.

Although the superior properties of op-amps makes instrumentation amplifier designs (such as S2 and S3 of FIG. 1) virtually ideal dc-coupled differential amplifiers for use with the input-stage (S1) described in the present invention, similar improvements are obtained by connecting input-stage S1 to common transistor differential amplifiers (such as S4 of FIG. 2). ACamp3 (S5 of FIG. 3) is a specific implementation of the general differential amplifier (S4 of FIG. 2). The operating characteristics of ACamp3, constructed using the above specified components, are summarized in the following table:

| Amplifier Property | ACamp 3 | Brief Description |
|---|---|---|
| Bandwidth | 100 kHz | 3-dB bandwidth |
| Gain | 100 | differential gain (measured at 1 kHz) |
| Input Current | 9.3 nA | ac input current (measured at 1 kHz) |
| Input Impedance | >75 MΩ in parallel with <10 pF | differential input impedance (measured at 1 kHz) |
| Slew rate | 4 V/μsec | (measured at 1 kHz) |
| CMRR* | 120 dB @ 0.1 kHz | 20 kΩ |
|  | 120 dB @ 1.0 kHz | source impedance |
|  | 112 dB @ 10 kHz | (no imbalance) |
|  | 100 dB @ 0.1 kHz | 20 kΩ |
|  | 90 dB @ 1.0 kHz | source impedance |
|  | 70 dB @ 10 kHz | (1 kΩ imbalance) |

*CMRR is maximized once for each amplifier over a 1 to 10 kHz bandwidth; all CMRR measurements are acquired without further adjustments to improve CMRR at specific frequencies.

Notice from the table of results for ACamp3 that bootstrapping the input-stage followers of a standard dc-coupled differential amplifier design produces an ac-coupled differential amplifier with a combination of both high input impedance and high CMRR. Properties other than those summarized in the above table are the same as the properties published by Analog Devices for the AD624 instrumentation amplifier.

Although the description above contains many specificities, these should not be construed as limiting the scope of the invention but as merely providing illustrations of some of the presently preferred embodiments of this invention. For example, stages S1 and S2 in FIG. 1 (i.e., stage S3 removed from the circuit) require the addition of only a single resistor connected between terminal V11 and ground to produce a two-op-amp instrumentation amplifier version of the ac-coupled differential amplifier design that comprises the present invention. As another example, any of the common variations discussed above (i.e., replace BJTs Q1 and Q2 with FETS, replace I1, I2, and I3 with resistors, etc.) for the general circuit in FIG. 2 would produce an ac-coupled differential amplifier with high input impedance and high CMRR. Various additional changes and modifications will readily suggest themselves to those skilled in this art.

While preferred embodiments of the invention have been illustrated and described, it will be appreciated that various changes can be made therein without departing from the spirit and scope of the invention.

I claim:

1. An ac-coupled differential amplifier having a high common mode rejection ratio and input impedance and having a bootstrapped input stage, said amplifier comprising:
   first and second operational amplifiers each having a first input, a second input, and an output;
   first and second RC high-pass input filter means, each comprising capacitor means connected to said first input of one of said first and second operational amplifiers and resistor means connected between ground and said first input of one of said first and second operational amplifiers; and
   first and second bootstrap capacitor means, each connecting said resistor means in one of said first and second RC high-pass input filter means to said second input of one of said first and second operational amplifiers.

2. The ac-coupled differential amplifier of claim 1 further comprising:
   first and second balanced feedback resistors, each connected between said output and said second input of one of said first and second operational amplifiers; and
   a coupling resistor connecting each of said second inputs of said first and second operational amplifiers.

3. The ac-coupled differential amplifier of claim 2 further comprising:
   a third operational amplifier having a first input, a second input, and an output;
   first and second balanced input resistors each connecting said output of one of said first and second operational amplifiers with one of said first input and said second input of said third operational amplifier;
   a third balanced feedback resistor connecting said output and said first input of said third operational amplifier; and
   a fourth balanced feedback resistor connecting said second input of said third operational amplifier to ground.

4. The ac-coupled differential amplifier of claim 1 wherein said second inputs of said first and second operational amplifiers are inverting inputs, and said first inputs of said first and second operational amplifiers are non-inverting inputs.

5. The ac-coupled differential amplifier of claim 1 operatable in a frequency range of from about 0.5 to about 100 kHz.

6. The ac-coupled differential amplifier of claim 1 operatable in a frequency range of from about 0.5 to 10,000 Hz.

7. The ac-coupled differential amplifier of claim 1 wherein each of said bootstrap capacitor means is a single capacitor, each of said resistor means is comprised of two series connected resistors, and said first and second bootstrap capacitor means are each comprised of a bootstrap capacitor that connects one pair of said series connected resistors.

8. An ac-coupled differential amplifier having a high common mode rejection ratio and input impedance and having a bootstrapped input stage, said amplifier comprising:
   first and second operational amplifiers each having a first input, a second input, and an output;
   first and second RC high-pass input filter means, each comprising a capacitor connected to said first input of one of said first and second operational amplifiers and first and second filter resistors connected in series between ground and said first input of one of said first and second operational amplifiers;
   first and second bootstrap capacitors, each connecting said first and second filter resistors in one of said first and second RC high-pass input filter means and said second input of one of said first and second operational amplifiers.

9. The ac-coupled differential amplifier of claim 8 further comprising:
   first and second balanced feedback resistors, each connected between said output and said second input of one of said first and second operational amplifiers;
   a coupling resistor connecting each of said second inputs of said first and second operational amplifiers.

10. The ac-coupled differential amplifier of claim 9 further comprising:
    a third operational amplifier having a first input, a second input, and an output;
    first and second balanced input resistors each connecting said output of one of said first and second operational amplifiers with one of said first input and said second input of said third operational amplifier;
    a third balanced feedback resistor connecting said output and said first input of said third operational amplifier; and
    a fourth balanced feedback resistor connecting said second input of said third operational amplifier to ground.

11. The ac-coupled differential amplifier of claim 8 wherein said second inputs of said first and second operational amplifiers that are each connected to one said first and second bootstrap capacitors are inverting inputs, and said first inputs of said first and second operational amplifiers are non-inverting inputs.

12. The ac-coupled differential amplifier of claim 8 operatable in a frequency range of from about 0.5 to about 100 kHz.

13. The ac-coupled differential amplifier of claim 8 operatable in a frequency range of from about 0.5 to about 10,000 Hz.

14. A bootstrapped input stage providing a high common mode rejection ratio and input impedance for a differential amplifier having a first input, a buffered first input, a second input, a buffered second input, and differential outputs, said bootstrapped input stage comprising:
   first and second RC high-pass input filter means, each comprising a capacitor connected to one of the first and second inputs of said differential amplifier and first and second filter resistors connected in series between ground and one of the first and second inputs of the differential amplifier; and
   first and second bootstrap capacitors, each connecting said first and second filter resistors in one of said first and second RC high-pass input filter means and one of the buffered first input and the buffered second input of the differential amplifier.

15. The bootstrapped input stage of claim 14 in which the differential amplifier is operatable in a frequency range of from about 0.5 to about 100 kHz.

16. The bootstrapped input stage of claim 14 in which the differential amplifier is operatable in a frequency range of from about 0.5 to about 10,000 Hz.

17. An ac differential amplification circuit for amplifying the difference between two input signals comprising:
   a differential input stage having an input impedance means and having a bootstrapped ac-coupling means, said input impedance means receiving the input signals and producing first and second output signals in response thereto, and said bootstrapped ac-coupling means having first and second inputs and producing at least a first output signal and at least a second output signal;
   first and second buffer means each having an input and an output, with said output of each of said buffer means respectively connected to separate ones of said first and second inputs of said bootstrapped ac-coupling means; and differential amplifier means having first and second differential inputs and a differential output, said first and second differential inputs being respectively connected to separate ones of said inputs of said first and second buffer means and to receiving separate ones of said first and second output signals of said input impedance means.

18. The ac differential amplification circuit of claim 17 wherein said input impedance means comprises first and second high-pass filter means each connected to one of said first and second output signals produced by said input impedance means; and wherein said bootstrapped ac-coupling means comprises separate capacitance means each having a distinct one of said first and second bootstrapped ac-coupling inputs and being coupled between one of said first and second high pass filter means and one of said at least a first output signal and at least a second output signal of said bootstrapped ac-coupling means so as to cause both an effective increase in the input impedance of said differential input stage and an effective decrease in the input loading of said differential amplifier means.

19. The ac differential amplification circuit of claim 17 wherein said input impedance means has a first input including a first high-pass filter means and a second input including a second high-pass filter means, and wherein said bootstrapped ac-coupling means comprises two separate capacitance means each connected between a distinct one of said first and second high-pass filter means of said input impedance means and one of said first and second inputs of said bootstrapped ac-coupling means so as to effectively decrease voltage drop across said first and second high-pass filter means and thereby both effectively increase the input impedance of said first and second inputs of said differential input stage and effectively decrease the input loading of said differential amplifier means.

20. The ac differential amplification circuit of claim 17 wherein said differential amplifier means as well as said first and second buffer means together comprise first and second distinct operational amplifiers, each distinct operational amplifier having inverting and noninverting inputs and an output, and wherein said noninverting inputs of each of said first and second distinct operational amplifiers is one of said first and second differential inputs of said differential amplifier means, and wherein said bootstrapped as-coupling means comprises a first and second capacitor each coupled between separate ones of said inverting inputs of said first and second operational amplifiers and said input impedance means.

21. The ac differential amplification circuit of claim 17 wherein said first and second buffer means comprises first and second follower amplifier means coupled respectively to separate ones of said differential inputs.

22. The ac differential amplification circuit of claim 21 wherein said differential amplifier means and said first and second follower means together comprise first and second emitter coupled transistors, each emitter coupled transistor having an emitter, collector, and base, and wherein said base of each of said first and second emitter coupled transistors is one of said first and second differential inputs of said differential amplifier means, and wherein said bootstrapped as-coupling means comprises a first and second capacitor coupled between separate ones of said emitters of said first and second emitter coupled transistors and said input impedance means.

23. A method of providing a high common mode rejection ratio and input impedance for a differential amplifier having a first input, a buffered first input, a second input, a buffered second input and differential outputs, said method comprising the steps of:

connecting first and second capacitor means to the first and second inputs of the differential amplifier, respectively;

connecting first and second filter resistor means between ground and the first and second inputs of the differential amplifier, respectively;

connecting first and second bootstrap capacitor means between said first and second filter resistor means and the buffered first and second inputs, respectively.

24. The method of claim 23 wherein said first and second capacitor means each comprise a single capacitor, said first and second filter resistor means each comprise a pair of series connected resistors and said first and second bootstrap capacitor means each comprise a single capacitor.

* * * * *